(12) United States Patent
Wan (10) Patent No.: US 7,005,958 B2
(45) Date of Patent: Feb. 28, 2006

(54) DUAL AXIS MAGNETIC SENSOR

(75) Inventor: Hong Wan, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/171,884

(22) Filed: Jun. 14, 2002

(65) Prior Publication Data

US 2003/0231098 A1 Dec. 18, 2003

(51) Int. Cl.
*H01C 7/04* (2006.01)

(52) U.S. Cl. .................................. 338/32 R; 324/252
(58) Field of Classification Search ............... 338/32 R; 324/252

See application file for complete search history.

(56) References Cited

U.S. PATENT DOCUMENTS

| | | | |
|---|---|---|---|
| 4,949,039 A | | 8/1990 | Grunberg |
| 5,159,513 A | | 10/1992 | Dieny et al. |
| 5,206,590 A | | 4/1993 | Dieny et al. |
| 5,247,278 A | | 9/1993 | Pant et al. |
| 5,561,368 A | | 10/1996 | Dovek et al. |
| 5,686,837 A | | 11/1997 | Coehoorne et al. |
| 5,729,137 A | * | 3/1998 | Daughton et al. .......... 324/252 |
| 5,945,825 A | * | 8/1999 | Clemens ..................... 324/252 |
| 5,952,825 A | * | 9/1999 | Wan ............................ 324/252 |
| 6,020,738 A | * | 2/2000 | Van Den Berg et al. .... 324/252 |
| 6,084,405 A | * | 7/2000 | Suzuki ........................ 324/252 |
| 6,100,686 A | * | 8/2000 | Van Delden et al. ....... 324/252 |
| 6,175,296 B1 | * | 1/2001 | Tokunaga et al. ......... 338/32 R |
| 6,304,074 B1 | * | 10/2001 | Waffenschmidt ............ 324/202 |
| 6,313,627 B1 | | 11/2001 | Van Den Burg |
| 6,522,132 B1 | * | 2/2003 | Vieux-Rochaz et al. ..................... 324/207.21 |
| 6,529,114 B1 | * | 3/2003 | Bohlinger et al. ......... 338/32 R |
| 2003/0106731 A1 | * | 6/2003 | Marino et al. .............. 180/168 |

OTHER PUBLICATIONS

English translation of Hei 2–186285, date unknown.*
Article entitled "The Magnetoresistive Sensor", Phillips Components, found in the Phillips Technical Publication 268, May 1990 issue.
Article entitled "Magnetic Sensing" found in the Honeywell AN–209, Apr. 2000 issue.
Philips, KMZ51 Magnetic field sensor Product Description, pp. 1–3, no date.
Philips, KMZ52 Magnetic field sensor Product Description, pp. 1–3 no date.

* cited by examiner

*Primary Examiner*—Karl D. Easthom
(74) *Attorney, Agent, or Firm*—Matthew Luxton

(57) ABSTRACT

A two-axis magnetic field sensor includes a substrate, a first sensor having at least one magnetoresistive element formed of GMR material on the substrate has a free layer having an easy axis of effective anisotropy field in a first direction. The first sensor is sensitive to magnetic field components perpendicular to the first direction. A current is caused to flow through the first sensor and variations in the resistivity of the first sensor due to the first magnetic field components are sensed. A second sensor having at least one magnetoresistive element formed of GMR material on the substrate has a free layer having an easy axis of effective anisotropy field in a direction substantially perpendicular to the first direction. The second sensor is sensitive to second magnetic field components perpendicular to its easy axis of effective anisotropy. A current is caused to flow through the second sensor and variations in the resistivity of the second sensor due to second magnetic field components are sensed.

20 Claims, 4 Drawing Sheets

DUAL AXIS MAGNETIC SENSOR

BACKGROUND OF THE INVENTION

The present invention relates generally to magnetic field sensing devices and specifically to magnetic field sensing devices capable of sensing magnetic fields along two mutually perpendicular axis. Such two axis or dual axis magnetic field sensors are required in many applications. Electronic compasses, magnetic field probes, and virtual reality are a few examples of applications where two axis magnetic field sensors are useful.

In the past, two axis magnetic field sensors were typically constructed using two single axis magnetic sensors. For simplicity, these will be referred to herein as an x-axis sensor and a y-axis sensor meaning that the two axes are perpendicular. The two single axis sensors could be housed in a single package enclosure and oriented so that their sensitive directions were perpendicular to each other. Alternatively, two single axis individually packaged die could be mounted on a circuit board with the sensitive axis of each die perpendicular to the other die. There are disadvantages to the use of two single axis die. One disadvantage of this approach is that it requires extra assembly effort either at the package level or at the board level. In addition, it is difficult to locate the two single axis die so that they are orthogonal to each other. The best control on the orthogonality of the two single axis parts in high volume manufacture may be on the order of ±2°, which induces the same level error on compass heading or about 0.06% error in a magnetic field measurement.

Earlier magnetoresistor-based magnetic field sensors utilized anisotropic magnetoresistance (AMR) wherein the resistance of a magnetoresistor varied as the cosine squared of the angle between the magnetization direction of the magnetoresistor and the direction of the current flow in the magnetoresistor. An example of a magnetic field sensor using AMR elements in a Wheatstone bridge circuit is described in U.S. Pat. No. 5,247,278, assigned to Honeywell.

More recently, a very different principle has been utilized in magnetic field sensors, wherein the resistance of multilayer film with at least two separated ferromagnetic layers varies as the cosine of the angle between the magnetizations of the two layers and is independent of current direction so long as the current is in the plane of the film. This resistance change caused by a magnetic field is named Giant Magnetoresistance (GMR) and is a much greater change than is found in AMR materials. GMR materials are more difficult to construct but offer much greater sensitivity to magnetic fields when compared to AMR materials. The classes of GMR materials that could be used in magnetic field sensors include multilayer film, spin-valve film or spin dependent tunneling film.

A multilayer GMR film includes a stack of alternated ferromagnetic layers and noble metal layers, such as Co/Cu/Co/Cu . . . or NiFeCo/Co/Cu/Co/NiFeCo/Co/Cu . . . When adjusting thickness of the Cu layer, the two magnetic layers adjacent to the Cu layer could have opposite magnetization directions through exchange coupling at zero applied magnetic field and the resistivity is high. Applying a magnetic field in the direction perpendicular to the magnetization directions, the magnetization of each of the ferromagnetic layers rotates toward the applied field direction, the relative angle between the magnetization in the adjacent layer becomes smaller, and the resistivity decreases.

A spin valve film typically includes two ferromagnetic layers, one space layer and one pinning layer. The pinning layer usually is an antiferromagnetic layer used to pin the magnetic moment of the immediate adjacent magnetic layer. The other ferromagnetic layer, separated by the space layer, is free to rotate its magnetic moment. When a magnetic field is applied, the magnetic moment of the free layer will rotate toward the field and the relative angle between the magnetization of the pinning layer and the magnetization of the free layer will change causing a resistance change.

A magnetic field sensor sensitive to very small applied magnetic fields can be constructed utilizing a spin dependent tunneling principle. A spin dependent tunneling magnetoresistor includes first and second ferromagnetic layers separated by a very thin non-magnetic insulating film. Current is conducted through the insulating layer based on a quantum electrodynamic effect or "tunneling" current. For a given thickness of the insulating layer, the amount of tunneling current is largely a function of the directions of magnetization in the ferromagnetic layers located on either side of the insulating layer. These directions of magnetization are varied by the magnetic field to be sensed and the resulting change in resistance is detected. Thus, a need exists for a GMR based two-axis magnetic field sensor that will provide significantly improved sensitivity to magnetic fields, may be readily fabricated on a single semiconductor die, and utilizes many known semiconductor processes.

SUMMARY

The present invention solves these and other needs by providing a dual axis magnetic field sensor including a first sensor having at least one magnetoresistive element formed on a substrate and having at least a first ferromagnetic layer, a non-magnetic layer, and a second ferromagnetic layer. The second thin film layer has an easy axis of effective anisotropy field in a first direction at zero applied magnetic field. The first sensor is sensitive to first magnetic field components in a direction perpendicular to the easy axis of effective anisotropy field. A current flow is produced through said first sensor and variations in the resistance of said first sensor due to the first magnetic field components are sensed. A second sensor including at least one magnetoresistive element is formed on the substrate and has at least a first ferromagnetic layer, a non-magnetic layer and a second ferromagnetic layer. The second thin film layer has an easy axis of effective anisotropy field in a direction perpendicular to the first direction at zero applied magnetic field. The second sensor is sensitive to second magnetic field components in a direction perpendicular to its easy axis of effective anisotropy field. A current flow is produced through said second sensor and variations in the resistance of said second sensor due to the second magnetic field components are sensed.

DESCRIPTION OF THE PREFERRED EMBODIMENT

Figure 1A:
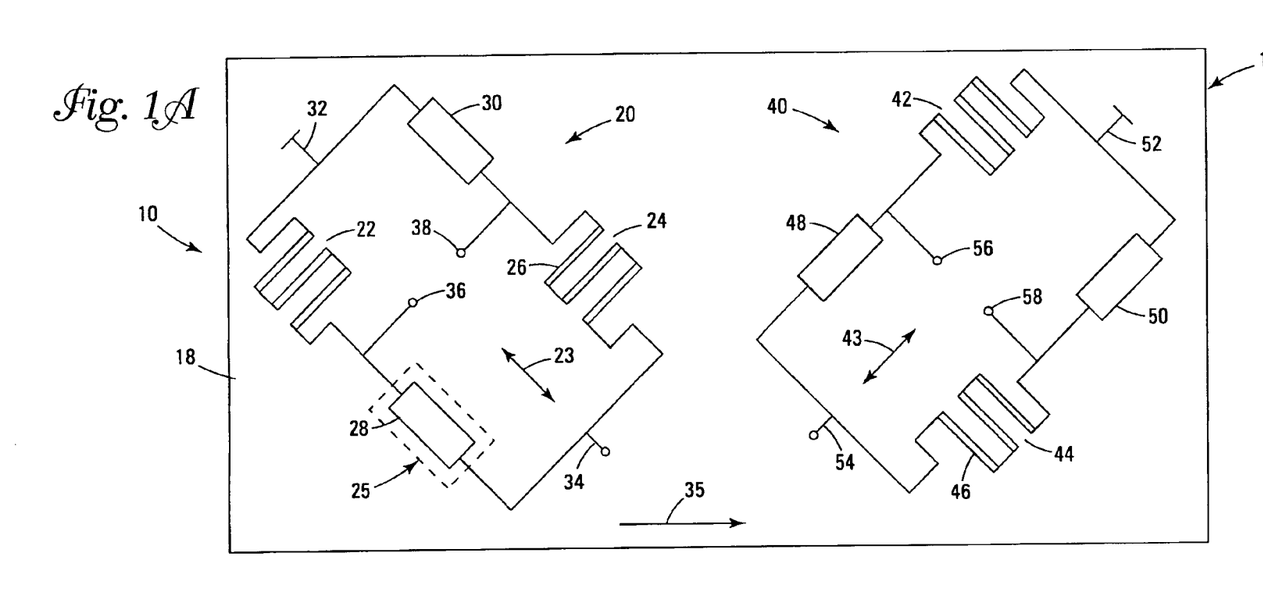
FIG. 1A is a top plan view of a specific embodiment of a two axis sensor according to the principles of the present invention.
Figure 1B:
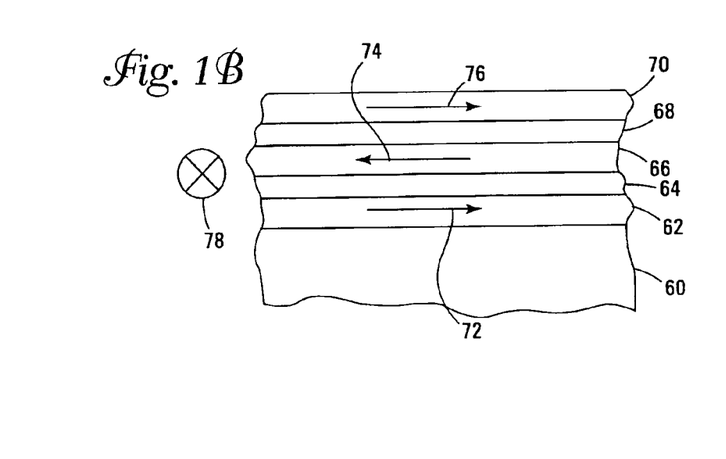
FIG. 1B is a partial sectional view of a magnetoresistive material as used in the embodiment of FIG. 1A and a diagrammatic representation of a direction of applied magnetic field.
Figure 1C:
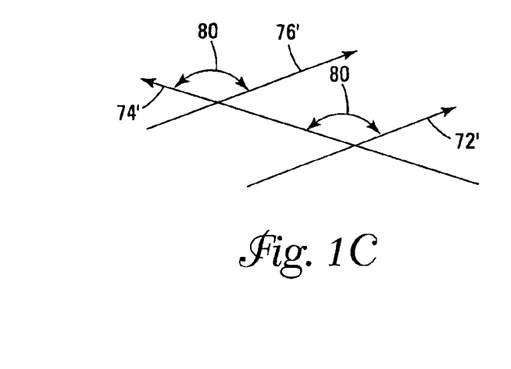
FIG. 1C is a top plan view of the direction of magnetization of specific layers of FIG. 1B in response to the applied field of FIG. 1B.

A two-axis magnetic field sensor, according to the principles of the present invention, can be made of multilayer GMR film, spin-valve film or spin dependent tunneling film. A device for sensing magnetic field components along two axes is shown in the drawings and generally designated 10. FIG. 1A shows a schematic circuit for a magnetic field sensor in accordance with the present invention. Wheatstone bridge 20 includes magnetoresistive elements 22 and 24 located in opposing legs. Elements 22 and 24 are made up of individual strips 26 of multilayer GMR material, for example, as shown in FIG. 1B. Only a few strips are shown for simplicity, but larger numbers of strips may be used. Resistors 28 and 30 are located in the remaining opposing legs of bridge 20. Resistors 28 and 30 are to be resistors having resistance versus temperature characteristics identical to those of elements 22 and 24 but there resistance is not to be sensitive to a magnetic field. Alternatively, additional elements identical to GMR elements 22 and 24 may be used, provided shielding 25 as shown at element 28 is used to shield these elements from magnetic fields. Bridge 20 also has a positive voltage connection 32 and a connection 34 to a reference voltage, which is typically ground, and an output at 36 and 38. The sensitive direction is perpendicular to the strip length as shown by 23 and is determined by the easy axis of the effective anisotropic field and is dominated by the shape anisotropic field. During construction layout of bridge 20, individual strips 26 of bridge 20 are oriented to be displaced counterclockwise from the easy axis 35 of the crystal anisotropic field. The sensitive direction is perpendicular to the effective anisotropic field, which is substantially parallel to the strip length when the shape anisotropic field is dominant.

Wheatstone bridge 40 includes elements 42 and 44 located in opposing legs and made up of individual strips 46. Resistors 48 and 50 are located in the remaining opposing legs of bridge 40 and there resistance is not to be sensitive to a magnetic field. Bridge 40 also includes positive voltage connection 52 and a connection 54 to a reference voltage, which is typically ground and an output at 56 and 58. During construction layout of bridge 40, individual strips 46 are oriented to be displaced clockwise from the easy axis 35 of the crystal anisotropic field. The sensitive direction is substantially perpendicular to strip length as shown by 43, when the construction of the strip width and film thickness is such that the shape anisotropic field is dominant over the crystal anisotropic field. Changing the width of the strip will change the shape anisotropic field. The shape anisotropic field= $4\pi M_s t/w$ where $M_s$ is the saturation magnetization of the free layer, t is the thickness of the free layer and w is the width of the strip.

For bridge 20 and bridge 40, the relative physical orientation of the length of strips 26 and strips 46 must be given careful consideration. An elongated strip of magnetoresistive material may be considered to have an associated crystal anisotropy field and a shape anisotropy field. The total or effective anisotropy field is the vector sum of the crystal anisotropy field and the shape anisotropy field. FIG. 1B shows the strips at plus 45 degrees and minus 45 degrees to the crystal easy axis for simplicity only. The actual layout must give consideration to the crystal anisotropy of the wafer, the shape anisotropy of strips 26 and 46, and the effective anisotropy of the strips. The easy axis of the crystal anisotropy field of a magnetic film is determined by the nature of the magnetic material used and the magnetic field direction applied during the deposition and annealing of the magnetoresistive material. According to the principles of the present invention, strips 26 and 46 are to be oriented so that their effective anisotropy fields are substantially perpendicular to each other. The effective anisotropic field determines the stable initial magnetization direction and sensitivity of the sensor; however, stable initial magnetization can be achieved within a small angle range from the effective anisotropical field. Therefore, the sensitive directions of two sensors can be perpendicular to each other even though the total anisotropical field is not perfectly perpendicular. The layout could be 0 degrees and 90 degrees if the crystal anisotropy field is small or negligible. The initial magnetic moment alignment along the strip length could be self-aligned or could be aligned by a strong magnetic field. For example, a set/reset pulse could be used. In order to have matching sensitivity for two axis sensors, the width of the strips can be adjusted for each axis to have the same anisotropic fields in the initial magnetization directions. Sensitivity is proportional to the GMR ratio divided by the anisotropical field along the initial magnetization direction and is given by $S=\Delta R/R \times 1/H_s$ FIG. 1B shows the construction of a multilayer GMR film which can be obtained, for example, by successively depositing on a silicon substrate 60: a first Co layer 62, a first Cu layer 64, a second Co layer 66, a second Cu layer 68, and a third Co layer 70 typically followed by repetition of these depositions. The thickness of the Cu layers is typically 8–30 angstroms and the thickness of the Co layers is typically 20 to 60 angstroms, with the thicknesses selected to provide negative exchange coupling. Electrical connections (not shown), as known in the art, are provided to permit electrical connection to the ends of the layered structure, a portion of which is shown in FIG. 1B. Additional layers (not shown) may also be deposited, for example a suitable underlayer of, for example, Ta is deposited on substrate 60 prior to the deposition of first ferromagnetic layer 62, and a capping layer, of for example Ta or SiN will be deposited over the electrical leads. The adjacent magnetic layers have opposite magnetization direction at zero applied field as indicated by arrows 72, 74, and 76, and the resistivity is high. When a magnetic field in the direction perpendicular to the magnetization direction, i.e., into the paper as shown by 78 is applied, the magnetization of each ferromagnetic layer rotates, in a plane perpendicular to the paper, toward the applied field direction and forms a scissors like shape as indicated by arrows 72', 74', and 76' and the relative angle 80 between the magnetization in the adjacent layers is smaller, and the resistivity decreases. Bridge 20 and Bridge 40 provide a unipolar output at terminals 36, 38 and at terminals 56, 58 respectively. The output is representative of magnetic field components in the plane of substrate 18 and in the sensitive direction of the x-axis or y-axis sensor.

Figure 2A:
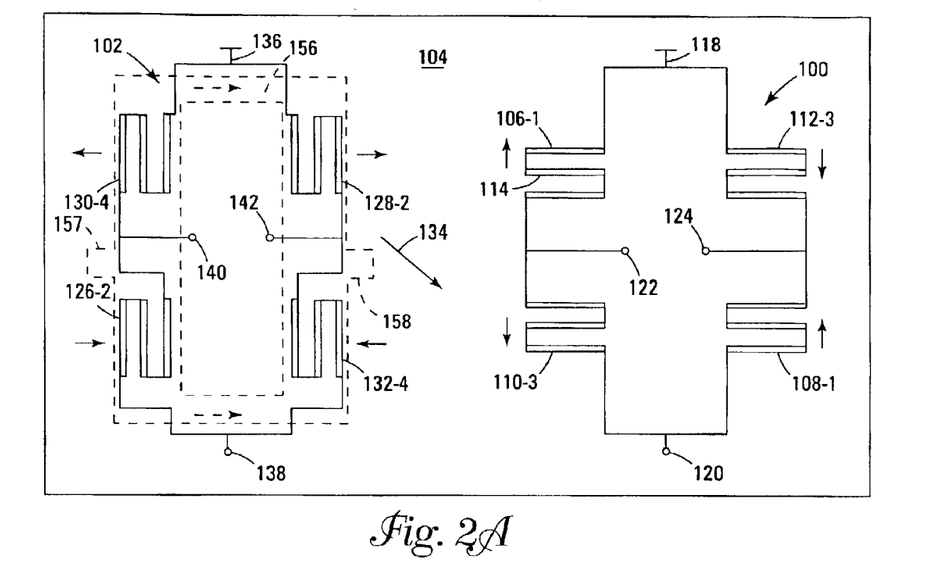
FIG. 2A is a top plan view of another specific embodiment of a two axis sensor according to the principles of the present invention.
Figure 2B:
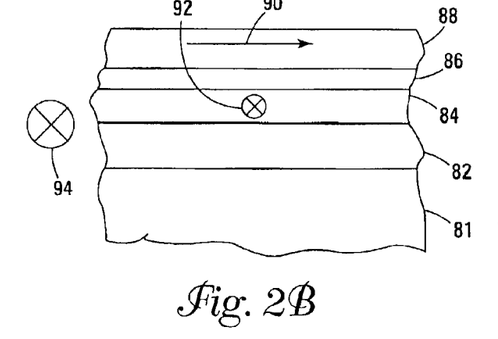
FIG. 2B is a sectional view of a magnetoresistive material as used in the embodiment of FIG. 2A and a diagrammatic representation of a direction of applied magnetic field.
Figure 2C:
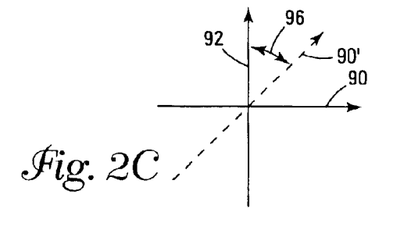
FIG. 2C is a top plan view of the direction of magnetization of specific layers of FIG. 2B in response to the applied field of FIG. 2B.

In another embodiment, a dual axis sensor, according to the principles of the present invention, can be made utilizing a spin valve principle. FIG. 2B shows the construction of a film which can be obtained, for example, by successively depositing on a silicon substrate 81: an antiferromagnetic layer 82 of, for example, FeMn, a pinned magnetic layer 84 of Co or CoFe, a space layer 86 of a noble metal, such as Cu, and a free magnetic layer 88 of NiFe or Co/NiFe. In the absence of a magnetic field that is to be sensed, the magnetic moment 90 of free magnetic layer 88 should be along the length of the strip as shown. Antiferromagnetic layer 82 effectively pins the magnetization 92 of pinned magnetic layer 84 in a direction perpendicular to magnetic moment 90. When a magnetic field to be sensed is applied in the direction as indicated by 94, i.e., into the paper, the magnetic moment 90 of free layer 88 rotates to, for example, position 90' changing the angle between the magnetization of pinned layer 84 and the magnetization of free layer 90 to the angle 96 (FIG. 2C). FIG. 2A shows a schematic of a Wheatstone bridge 100 and a Wheatstone bridge 102 formed on a substrate 104. Bridge 100 includes magnetoresistive elements 106-1 and 108-1 located in diagonally opposite legs, and made up of individual strips 114 of spin valve GMR material, for example, as shown in FIG. 2B. Only a few strips are shown for simplicity, but larger numbers of strips may be used. Bridge 100 includes magnetoresistive elements 110-3 and 112-3 located in the remaining opposing legs. The pinning direction, as described in relation to FIG. 2B, is shown by an arrow adjacent each magnetoresistive element and bridge 100 is sensitive to magnetic field components in a direction perpendicular to strips 114. Bridge 100 also includes positive voltage connection 118, connection 120 to a reference voltage, which is typically ground, and an output at 122 and 124.

Figure 2D:
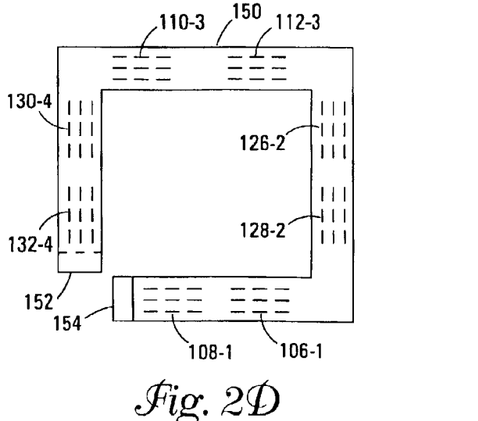
FIG. 2D is a diagrammatic representation of a conductor for setting a pinning direction in one layer of the magnetoresistive elements of the embodiment of FIG. 2A.
Figure 2E:
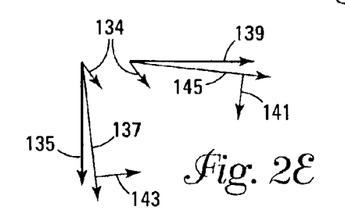
FIG. 2E is a diagrammatic representation of certain magnetic field relationships of FIG. 2A.

Similarly, Wheatstone bridge 102 includes magnetoresistive elements 126-2 and 128-2 located in opposing legs and made up of individual strips 114. Bridge 102 includes magnetoresistive elements 130-4 and 132-4 in the remaining opposing legs. Bridge 102 is sensitive to magnetic field components in a direction perpendicular to the strips in bridge 102. Bridge 102 also includes positive voltage connection 136, connection 138 to a reference voltage, which is typically ground and an output at 140 and 142. The physical orientation of the magnetoresistive elements is shown differently in FIG. 2A than in FIG. 1A. The principal of long strip orientation should be the same for the embodiment of FIG. 2 as for the embodiment of FIG. 1. The layout of the two bridges should be rotated 45 degrees in opposite directions from the crystal anisotropic field 134 as shown in FIGS. 2A and 2E, or the bridges may be oriented at 0 and 90 degrees if the crystal anisotropical field is small or negligible. In FIG. 2E, 135 represents the shape anisotropic field of the elements of bridge 102, 134 represents the crystal anisotropic field and 137 represents the effective anisotropic field. For the elements of bridge 100, 139 represents the shape anisotropic field, 134 represents the crystal anisotropic field, and 145 represents the effective anisotropic field. 143 represents the sensitive direction of bridge 102 and 141 represents the sensitive direction of bridge 100. It is seen that the effective anisotropic fields are not completely perpendicular, but form an angle a few degrees less than 90 degrees and still provide very satisfactory operation. For spin valve GMR films, both legs of the bridge contribute an output signal, because the pinning layer magnetization is fixed in a direction to provide bipolar output. For a full Wheatstone bridge, the complementary legs should have opposite direction of magnetization in the pinning layer, and the free layer should have the magnetic moment along the length of the strip. For a two-axis sensor, the two sensors should have a pinning direction perpendicular to each other. This can be accomplished for example by using a current conductor as shown in FIG. 2D. Conductor 150 forms a generally square shape and has terminals 152 and 154 located at its ends. Magnetoresistive elements of bridge 100 and 102 are located below conductor 150 and have two orientations, i.e., elements 1 (for example element 106-1) and 3 having one orientation and elements 2 and 4 having an orientation perpendicular to the orientation of elements 1 and 3. When a current, referred to as a fixing current, is passed through conductor 150 in a clockwise direction, a magnetic field will be provided in opposite directions at elements 1 and 3 and in opposite directions at elements 2 and 4. By heating the wafer to a temperature above the Neal temperature of antiferromagnetic layer 82 with sufficient current in conductor 150 and then allowing it to cool in the presence of the magnetic field from the fixing current in conductor 150, the desired pinning directions can be obtained. For example, if the antiferromagnetic layer 82 is FeMn and it is heated to approximately 160 to 180 degrees C., this temperature will be above what is required to reset the sub-lattice magnetization of the FeMn to align the magnetization of adjacent pinned layer 84 with the preferred directions. The free layer will have a direction of magnetization along the length of the elements and the pinned direction will be perpendicular to this direction. Conductor 150 could be included in the construction of each two axis sensor die with terminals 152 and 154 available for contacting at the wafer level with probe testing type of connections. Conductor 150 is shown as a single-wide conductor, but could be multiple narrower conductors in a spiral like arrangement to perform the pinning function with less current. Alternatively conductor 150 could be housed within a fixture with the fixture being positioned over the die at the wafer level and the fixing current being passed through the conductor while the wafer is heated and cooled as described. Conductor 150 is shown as a simple square form, but could be designed for different spatial arrangements of the magnetoresistive elements. For example with the magnetoresistive elements physically located as shown in FIG. 2A, a conductive strap 156 as shown by the dotted lines could be patterned to pass over the elements with the appropriate orientation and current direction as shown by the arrows and with current entering at 157 and leaving at 158. A similar strap rotated 90 degrees could be located over bridge 100. Other arrangements for pinning could be devised. As an alternative to pinning according to the previously described heating and cooling process, the pinning could be accomplished with a one time current pulse of sufficient size to cause the pinning.

The previous embodiments have described arranging elongated sensor elements of the two sensors so that they are located symmetrically with respect to the crystal anisotropic easy axis of the free layer which results in the two sensors having the same sensitivity. In some applications, it will not be necessary that the x-axis and y-axis sensor have the same sensitivity. In another embodiment, techniques other than those already described may be used in applications that require the same sensitivity for the two axes. One example is adjusting the width of the elements of one of the sensor. For example, with reference to FIG. 4, where the crystal anisotropic field of the free layer material is $H_k$ and it is in a fixing direction for a wafer. Long strips 160 represent the legs of a Wheatstone bridge layout for sensor A with strips 160 parallel to crystal anisotropic easy axis $H_k$. Assuming length $L_A$ of the strips 160 is much larger than width $W_A$, i.e., at least three times larger, then the easy axis of the shape anisotropy field is along the strip length. Shape anisotropic field is $H_s=4\pi M_s t/W$, where $M_s$ is saturation magnetization of the free layer material, t is the thickness of the free layer and W is the width of the strip.

Figure 4:
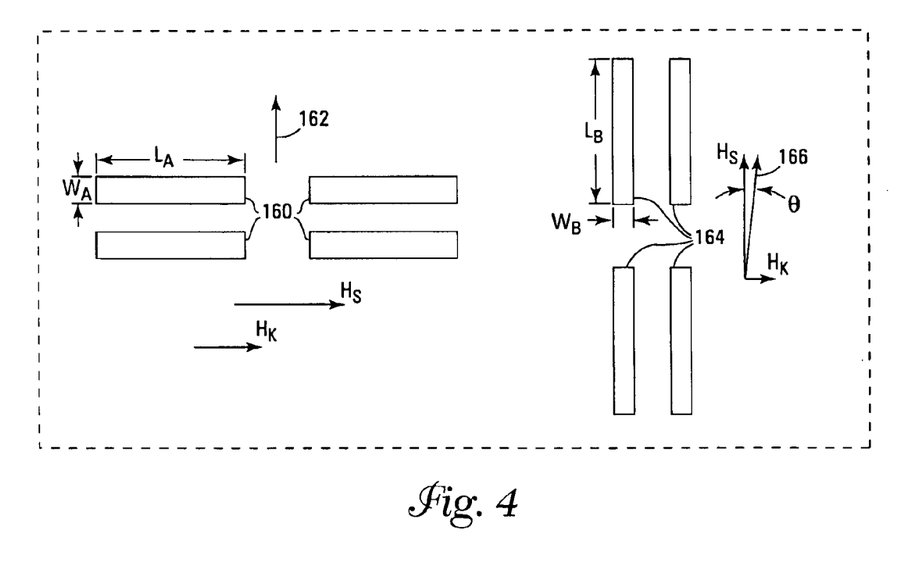
FIG. 4 is a top plan view of a partial layout of an embodiment of a two-axis sensor according to the principles of the present invention.

The effective anisotropic field is the sum of crystal and shape anisotropic field, the effective anisotropic field determines the sensitivity of the sensor.

$$H_{A,B}(eff)=H_k+H_{s,A,B} \quad [1]$$

For Sensor A, $H_k$ is parallel to $H_{sA}$, $H_{A\ (eff)}$ has value of $(4\pi Ms\ t/W_A+H_k)$ and with direction parallel to crystal anisotropic easy axis. Sensor A is sensitive to magnetic field components in a direction as shown by 162.

Long strips 164 represent the legs of a Wheatstone bridge layout for sensor B with strips perpendicular to crystal anisotropic field easy axis.

For Sensor B, $H_k$ is perpendicular to $H_{sB}$, $H_B$(eff), as shown by 166 has a value of $$\sqrt{\left(4\pi M_s \frac{t}{W_B}\right)^2 + H_k^2} \quad [2]$$

and with a direction having an angle θ away from its long strip, $$\theta = \arctan\left[\frac{H_k}{4\pi M_s\left(\frac{t}{W_B}\right)}\right] \quad [3]$$

When Hk<<4πMs t/W, θ is small, and a large magnetic field, for example as provided by a set/reset pulse can be used to initially align the magnetic moment in sensor B along its long strip direction, and adjusting the strip width of $W_A$ and $W_B$, to let $$4\pi M_s \frac{t}{W_A} + H_k = \sqrt{\left(4\pi M_s \frac{t}{W_B}\right)^2 + H_k^2}$$

then Sensor A and Sensor B have the same sensitivity and have sensitive directions substantially perpendicular to each other.

For example, if $H_k=2$ Oe, $4\pi M_s=10,000$, t=6 nm, and $W_A=6\mu$, then using the immediately preceding equation to calculate $W_B$ will result in $W_B$ of $5\mu$.

Figures 3A, 3B:
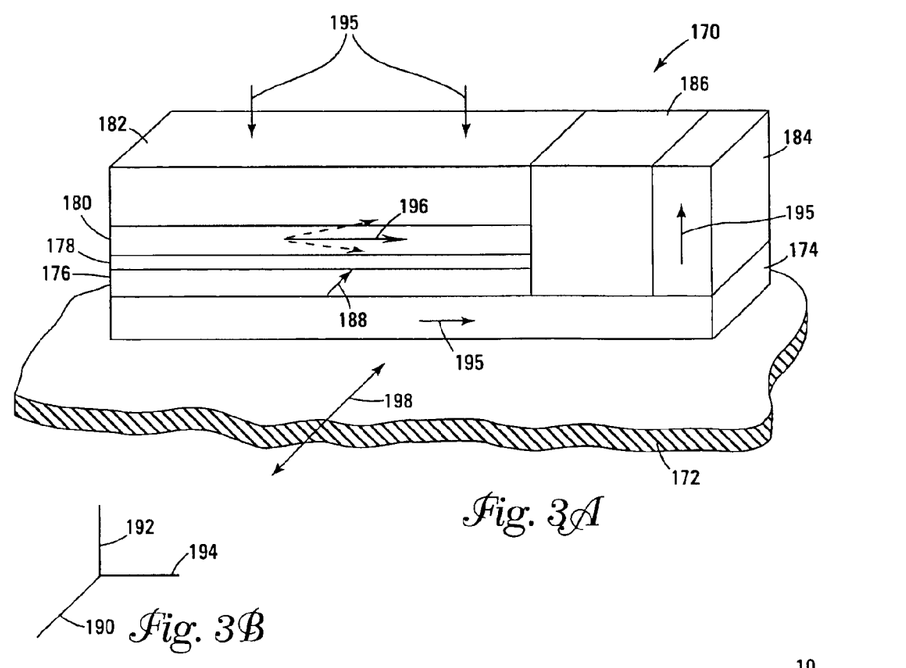
FIGS. 3A and 3B show diagrammatically the construction of a part of a magnetoresistive element based on spin dependent tunneling along with directions of magnetization within the element which is suitable for use with the present invention.

In yet another embodiment, a magnetic field sensor according to the principles of the present invention can be made utilizing spin dependent tunneling. FIG. 3A shows a magnetoresistive element 170 formed on a silicon substrate 172 and including antiferromagnetic layer 174, pinned layer 176 of, for example, Co, tunneling layer 178 of $Al_2O_3$, and permalloy layer 180. Pinned layer 176 is typically 20 to 80 angstroms in thickness, $Al_2O_3$ layer 178 is typically 8 to 18 angstroms in thickness and permalloy layer 180 is typically 30 to 60 angstroms in thickness. Element 170 also includes terminal 182 and terminal 184. Dielectric 186, typically of SiO2, isolates terminal 184 from certain portions of element 170. In use, antiferromagnetic layer 174 pins the magnetization of ferromagnetic layer 176 in a direction as shown by 188 along axis 190. The magnetization in ferromagnetic layer 180, in the absence of an applied magnetic field, is shown by arrow 196 and is along axis 194. Changes in magnetization in layer 180 are by rotation, in response to an applied magnetic field, such as magnetic field 198 are shown dashed in FIG. 3A. Rotation is in a plane parallel to a plane as defined by axis 190 and axis 194. Current direction within element 170 is shown by arrows 195.

Figure 3C:
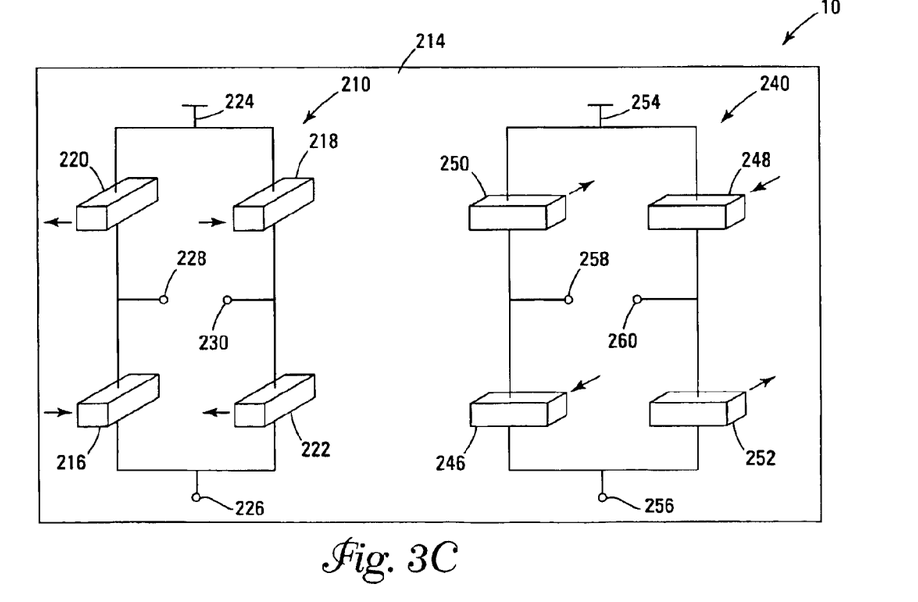
FIG. 3C is a top plan view of an embodiment of the present invention using the magnetoresistive element of FIG. 3A.

FIG. 3C shows Wheatstone bridge 210 and 240 formed on a substrate 214. Bridge 210 includes magnetoresistive elements 216 and 218 located in diagonally opposing legs and magnetoresistive elements 220 and 222 located in the remaining diagonally opposing legs. All magnetoresistive elements are based on a spin dependent tunneling element, for example as shown in FIG. 3C with the pinning direction of antiferromagnetic layer 174 as shown by arrows adjacent the elements in FIG. 3C. The discussion with regard to the use of a current carrying conductor extending over the magnetoresistive elements for the purpose of establishing pinning directions relative to the embodiment of FIGS. 2A–2D applies as well to the embodiment of FIGS. 3A–3C and is not repeated here. The magnetization of free layer 180 is along the length of the magnetoresistive elements. Bridge 210 also includes positive voltage connection 224, connection 226 to a reference voltage and an output at 228 and 230. Bridge 240 includes magnetoresistive elements 246 and 248 located in diagonally opposing legs and magnetoresistive elements 250 and 252 located in the remaining diagonally opposing legs. All magnetoresistive elements of bridge 240 are oriented perpendicular to elements of bridge 210 and the pinning direction is shown by arrows. Bridge 240 also includes positive voltage connection 254, connection 256 to a reference voltage and an output at 258 and 260.

The present invention requires means for monitoring the resistivity change of a magnetoresistive element as a function of a magnetic field. The invention has been described with reference to a Wheatstone bridge showing a voltage source applied to the bridge and output terminals. Of course, a current source may be used in lieu of the voltage source. In addition, there are well known arrangements of half bridges that may also be used.

Thus, since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than the foregoing description, and all changes which come within the meaning and range of equivalency of the claims are intended to be embraced therein.

What is claimed is:

1. A magnetic field sensing device comprising:
    a first sensor and a second sensor formed in a common plane on a single semiconductor substrate;
    said first sensor having a first bridge arrangement comprising GMR material formed on said substrate, said GMR material having a free layer having a crystal anisotropy field and having an easy axis of effective anisotropy field in a first direction, said first sensor being sensitive to first magnetic field components perpendicular to said first direction;

means for producing a current flow through said first sensor and sensing variations in the resistivity of said first sensor due to said first magnetic field components with an output of said first bridge arrangement representing said first magnetic field components;

said second sensor having a second bridge arrangement comprising said GMR material formed on said substrate, said GMR material having a free layer having said crystal anisotropy field and having an easy axis of effective anisotropy field in a second direction substantially perpendicular to said first direction, said second sensor being sensitive to second magnetic field components perpendicular to a sensitive direction of said first sensor, means for producing a current flow through said second sensor and sensing variations in the resistivity of said second sensor due to said second magnetic field components with an output of said second bridge arrangement representing said second magnetic field components.

2. The magnetic field sensing device of claim 1 wherein said free layer of said first sensor has a crystal anisotropic easy axis, a shape anisotropic field, and a shape anisotropic easy axis, with said shape anisotropic field being dominant and said first sensor is constructed with said shape anisotropic easy axis rotated in a clockwise direction away from said crystal anisotropic easy axis direction; and said free layer of said second sensor has said crystal anisotropic easy axis, a shape anisotropic field and a shape anisotropic easy axis, with said shape anisotropic field being dominant and said sensor is constructed with said shape anisotropic easy axis rotated in a counterclockwise direction away from said crystal anisotropic easy axis direction.

3. The magnetic field sensing device of claim 1 wherein said free layer of said first sensor has a crystal anisotropic easy axis, a shape anisotropic field and a shape anisotropic easy axis, with said shape anisotropic field being dominant and said first sensor is constructed with said shape anisotropic easy axis along said crystal anisotropic easy axis; and said free layer of said second sensor has said crystal anisotropic easy axis, a shape anisotropic field and a shape anisotropic easy axis, with said shape anisotropic field being dominant and said second sensor is constructed with said shape anisotropic easy axis substantially perpendicular to said crystal anisotropic easy axis.

4. The magnetic field sensing device of claim 3, wherein said free layer of said first sensor has a width and said free layer of said second sensor has a width that is selected to result in said second sensor having a sensitivity approximately equal to a sensitivity of said first sensor.

5. The magnetic field sensing device of claim 1 wherein said current through said first sensor and said second sensor is in a direction parallel to said substrate.

6. The magnetic field sensing device of claim 1 wherein said current through said first sensor and said second sensor is in a direction substantially perpendicular to said substrate.

7. A magnetic field sensing device comprising:

a first sensor and a second sensor formed in a common plane on a single semiconductor substrate;

said first sensor formed on said substrate and comprising at least one magnetoresistive element having a first and a second thin film layer of ferromagnetic material separated by a thin film layer of non-magnetic material with said second thin film layer of ferromagnetic material having a crystal anisotropy field and having an easy axis of effective anisotropy field in a first direction, with said first thin film layer having a direction of magnetization and said second thin film layer having a direction of magnetization at zero applied field;

means for producing a current flow through said magnetoresistive element of said first sensor;

means for sensing variations in the resistivity of said magnetoresistive element of said first sensor due to the difference in rotation of said magnetization in said first and said second layers as a function of first magnetic field components being sensed;

said second sensor formed on said substrate and comprising at least one magnetoresistive element having a first and a second thin film layer of ferromagnetic material separated by a thin film layer of non-magnetic material with said second thin film layer of ferromagnetic material having said crystal anisotropy field and having an easy axis of effective anisotropy field in a direction substantially perpendicular to said first direction, with said first thin film layer having a direction of magnetization and said second thin film layer having a direction of magnetization at zero applied field;

means for producing a current flow through said magnetoresistive element of said second sensor; and means for sensing variations in the resistivity of said magnetoresistive element of said second sensor due to the difference in rotation of said magnetization in said first and said second layers as a function of second magnetic field components being sensed wherein said second magnetic field components are perpendicular to said first magnetic field components.

8. The magnetic field sensing device of claim 7 wherein said first thin film layer direction of magnetization and said second thin film layer direction of magnetization of said first sensor are opposite directions at zero applied field and said first thin film layer direction of magnetization and said second thin film layer direction of magnetization rotate toward said first magnetic field components being sensed; and wherein said first thin film layer direction of magnetization and said second thin film layer direction of magnetization of said second sensor are opposite directions at zero applied field and said first thin film layer direction of magnetization and said second thin film layer direction of magnetization rotate toward said second magnetic field components being sensed.

9. The magnetic field sensing device of claim 8 wherein said at least one magnetoresistive element of said first sensor and said second sensor comprise repeated layers of a first and a second thin film layer of ferromagnetic material separated by a thin film layer of non-magnetic material and said non-magnetic material is selected from the group consisting of Cu, Cr, Ag, Zn, Pd and Ti.

10. The magnetic field sensing device of claim 7 wherein said second thin film layer direction of magnetization of said first sensor is substantially perpendicular to said first thin film layer direction of magnetization of said first sensor at zero applied field and only said second thin film layer direction of magnetization rotates in response to said first magnetic field components; and wherein said second thin film layer direction of magnetization of said second sensor is substantially perpendicular to said first thin film layer direction of magnetization of said first sensor at zero applied field and only said second thin film layer direction of magnetization rotates in response to said second magnetic field components.

11. The magnetic field sensor of claim 10 further comprising a current carrying conductor for fixing a direction of magnetization in said first thin film layer of said first sensor and said first thin film layer of said second sensor.

12. A magnetic field sensing device comprising:
 a first sensor and a second sensor formed in a common plane on a single semiconductor substrate;
 said first sensor comprising first, second, third and fourth magnetoresistive elements formed on said substrate and connected in a bridge arrangement having a first output, each of said magnetoresistive elements having a free magnetic layer having a crystal anisotropy field and having an easy axis of effective anisotropy field oriented in a first direction at zero applied magnetic field, a pinned magnetic layer, a spacer of non magnetic material between said free layer and said pinned layer, and a layer of antiferromagnetic material adjacent said pinned layer and pinning said pinned layer in a direction generally perpendicular to said easy axis of effective anisotropy field;
 said second sensor comprising fifth, sixth, seventh and eighth magnetoresistive elements formed on said substrate and connected in a bridge arrangement having a second output, each said magnetoresistive elements having a free magnetic layer having said crystal anisotropy field and having an easy axis of effective anisotropy field substantially perpendicular to said first direction at zero applied magnetic field, a pinned ferromagnetic layer, a spacer of non magnetic material between said free layer and said pinned layer and a layer of antiferromagnetic material adjacent said pinned layer and pinning said pinned layer in a direction generally perpendicular to said easy axis of effective anisotropy field;
 means for setting a direction of magnetization of said pinned layer of said magnetoresistive elements of said first sensor and of said second sensor so that a first pair of diagonally opposite bridge elements are pinned in one direction and a remaining pair of diagonally opposite bridge elements are pinned in a direction opposite said one direction; and
 wherein said first output is representative of first magnetic field components at said first sensor and substantially perpendicular to said first direction and said second output is representative of second magnetic field components at said second sensor and substantially perpendicular to said first magnetic field components.

13. The magnetic field sensing device of claim 12 wherein said means for setting a direction of magnetization comprises a conductor extending over said magnetoresistive elements of said first sensor and said second sensor for conducting a fixing current during fabrication of said device.

14. The magnetic field sensing device of claim 13 wherein said free layer of said first sensor has a crystal anisotropic easy axis, a shape anisotropic field, and a shape anisotropic easy axis, with said shape anisotropic field being dominant and said first sensor is constructed with said shape anisotropic easy axis rotated in a clockwise direction away from said crystal anisotropic easy axis direction; and
 said free layer of said second sensor has said crystal anisotropic easy axis, a shape anisotropic field and a shape anisotropic easy axis, with said shape anisotropic field being dominant and said sensor is constructed with said shape anisotropic easy axis rotated in a counterclockwise direction away from said crystal anisotropic easy axis direction.

15. The magnetic field sensing device of claim 13 wherein said free layer of said first sensor has a crystal anisotropic easy axis, a shape anisotropic field and a shape anisotropic easy axis, with said shape anisotropic field being dominant and said first sensor is constructed with said shape anisotropic easy axis along said crystal anisotropic easy axis; and
 said free layer of said second sensor has said crystal anisotropic easy axis, a shape anisotropic field and a shape anisotropic easy axis, with said shape anisotropic field being dominant and said second sensor is constructed with said shape anisotropic easy axis substantially perpendicular to said crystal anisotropy easy axis.

16. The magnetic field sensing device of claim 15 wherein said first sensor has a first sensitivity and said second sensor has a second sensitivity different from said first sensitivity.

17. The magnetic field sensing device of claim 5 wherein said free layer of said first sensor has a width and said free layer of said second sensor has a width that is selected to result in said second sensor having a sensitivity approximately equal to a sensitivity of said first sensor.

18. The magnetic field sensing device of claim 1 wherein said free layer of said first sensor has a direction of magnetization and an adjacent ferromagnetic layer has an opposite direction of magnetization and said directions of magnetization rotate toward said first magnetic field components; and
 said free layer of said second sensor has a direction of magnetization and an adjacent ferromagnetic layer has an opposite direction of magnetization and said directions of magnetization rotate toward said second magnetic field components.

19. The magnetic field sensing device of claim 1 wherein said free layer of said first sensor has a direction of magnetization and an adjacent ferromagnetic layer is pinned in a direction perpendicular to said direction of magnetization and said direction of magnetization of said free layer rotates in response to said first magnetic field components;
 said free layer of said second sensor has a direction of magnetization and an adjacent ferromagnetic layer is pinned in a direction perpendicular to said direction of said magnetization of said free layer and said direction of magnetization rotates in response to said second magnetic field components; and
 a direction of said current flow through said first sensor and a direction of current flow through said second sensor is in the plane of said first sensor and said second sensor.

20. The magnetic field sensing device of claim 1 wherein said free layer of said first sensor has a direction of magnetization and an adjacent ferromagnetic layer is pinned in a direction perpendicular to said direction of magnetization and said direction of magnetization of said free layer rotates in response to said first magnetic field components;
 said free layer of said second sensor has a direction of magnetization and an adjacent ferromagnetic layer is pinned in a direction perpendicular to said direction of said magnetization of said free layer and said direction of magnetization rotates in response to said second magnetic field components; and
 a direction of said current flow through said first sensor and a direction of current flow through said second sensor is perpendicular to the plane of said first sensor and said second sensor.

* * * * *